US009551577B2

(12) United States Patent
Ruohio et al.

(10) Patent No.: US 9,551,577 B2
(45) Date of Patent: Jan. 24, 2017

(54) GYROSCOPE STRUCTURE AND GYROSCOPE

(71) Applicant: MURATA MANUFACTURING CO., LTD., Nagaokakyo-shi, Kyoto (JP)

(72) Inventors: Jaakko Ruohio, Helsinki (FI); Anssi Blomqvist, Helsinki (FI)

(73) Assignee: MURATA MANUFACTURING CO., LTD., Nagaokakyo-shi, Kyoto (JP)

(*) Notice: Subject to any disclaimer, the term of this patent is extended or adjusted under 35 U.S.C. 154(b) by 51 days.

(21) Appl. No.: 14/607,223

(22) Filed: Jan. 28, 2015

(65) Prior Publication Data

US 2015/0211854 A1    Jul. 30, 2015

(30) Foreign Application Priority Data

Jan. 28, 2014 (FI) .................................... 20145087

(51) Int. Cl.
*G01C 19/5712* (2012.01)
*B81B 3/00* (2006.01)
*G01C 19/574* (2012.01)

(52) U.S. Cl.
CPC ......... *G01C 19/5712* (2013.01); *B81B 3/0043* (2013.01); *G01C 19/574* (2013.01); *B81B 2201/0242* (2013.01)

(58) Field of Classification Search
CPC ............... G01C 199/5712; B81B 2201/0242
See application file for complete search history.

(56) References Cited

U.S. PATENT DOCUMENTS

| 5,889,207 | A    | 3/1999  | Lutz     |              |
|-----------|------|---------|----------|--------------|
| 6,481,285 | B1 * | 11/2002 | Shkel    | G01C 19/5719 |
|           |      |         |          | 73/504.13    |
| 6,561,029 | B2 * | 5/2003  | Folkmer  | G01C 19/5712 |
|           |      |         |          | 73/504.12    |
| 7,155,978 | B2 * | 1/2007  | Lo       | G01C 19/5712 |
|           |      |         |          | 73/504.13    |
| 8,176,779 | B2 * | 5/2012  | Blomqvist| G01C 19/5712 |
|           |      |         |          | 73/504.12    |
| 8,256,290 | B2 * | 9/2012  | Mao      | G01C 19/5719 |
|           |      |         |          | 73/488       |
| 8,459,110 | B2 * | 6/2013  | Cazzaniga| G01C 19/5747 |
|           |      |         |          | 73/504.12    |
| 8,479,575 | B2 * | 7/2013  | Kempe    | G01C 19/5747 |
|           |      |         |          | 73/504.12    |

(Continued)

FOREIGN PATENT DOCUMENTS

CN    202793402 U    3/2013
EP    2 610 588 A2   7/2013

OTHER PUBLICATIONS

International Search Report application No. PCT/IB2015/050641 dated May 28, 2015.

(Continued)

*Primary Examiner* — Lisa Caputo
*Assistant Examiner* — Tran M Tran
(74) *Attorney, Agent, or Firm* — Squire Patton Boggs (US) LLP

(57) ABSTRACT

A gyroscope structure with a specific arrangement of drive and sense structures and coupling spring structures, which allows orthogonally directed motions of larger scale drive and sense structures in a very limited surface area.

10 Claims, 6 Drawing Sheets

(56) References Cited

U.S. PATENT DOCUMENTS

| | | | |
|---|---|---|---|
| 8,997,565 B2* | 4/2015 | Blomqvist | G01C 19/5747 701/532 |
| 9,032,796 B2* | 5/2015 | Stephanou | G01C 19/5712 73/510 |
| 9,194,704 B2* | 11/2015 | Lin | G01C 19/5747 |
| 2010/0313657 A1 | 12/2010 | Trusov et al. | |
| 2011/0303007 A1 | 12/2011 | Rocchi | |
| 2012/0024056 A1 | 2/2012 | Hammer | |
| 2013/0031977 A1 | 2/2013 | Kempe | |
| 2013/0167636 A1 | 7/2013 | Coronato et al. | |

OTHER PUBLICATIONS

Finnish Search Report dated Sep. 15, 2014 corresponding to Finnish Patent Application No. 20145087.

* cited by examiner

GYROSCOPE STRUCTURE AND GYROSCOPE

BACKGROUND

Field

The present invention relates to microelectromechanical devices and to a gyroscope structure and a gyroscope.

Description of the Related Art

Micro-Electro-Mechanical Systems, or MEMS, can be defined as miniaturized mechanical and electro-mechanical systems where at least some elements have a mechanical functionality. Since MEMS devices are created with the same tools used to create integrated circuits, micromachines and microelectronics can be fabricated on the same piece of silicon or other substrate to enable advanced machines.

MEMS structures can be applied to quickly and accurately detect very small changes in physical properties. For example, a microelectromechanical gyroscope can be applied to quickly and accurately detect very small angular displacements. Motion has six degrees of freedom: translations in three orthogonal directions and rotations around three orthogonal axes. The latter three may be measured by an angular rate sensor, also known as a gyroscope. MEMS gyroscopes use the Coriolis Effect to measure the angular rate. When a mass is moving in one direction and rotational angular velocity is applied, the mass experiences a force in orthogonal direction as a result of the Coriolis force. The resulting physical displacement caused by the Coriolis force may then be read from, for example, a capacitive, piezo-electrical or piezoresistive sensing structure.

In MEMS gyros the primary motion cannot be continuous rotation as in conventional ones due to lack of adequate bearings. Instead, mechanical oscillation may be used as the primary motion. When an oscillating gyroscope is subjected to an angular motion orthogonal to the direction of the primary motion, an undulating Coriolis force results. This creates a secondary oscillation orthogonal to the primary motion and to the axis of the angular motion, and at the frequency of the primary oscillation. The amplitude of this coupled oscillation can be used as the measure of the angular rate.

Gyroscopes are very complex inertial MEMS sensors, and still the tendency is towards more and more compact structures. The basic challenge in gyroscope designs is that the Coriolis force is very small and therefore the generated signals tend to be minuscule compared to other electrical signals present in the gyroscope. Spurious responses and susceptibility to vibration plague many compact MEMS gyro designs, like conventional tuning fork structures.

One known approach to reduce sensitivity to external vibrations is a balanced ring structure that includes a planar vibratory resonator that has a ring or hoop like structure with inner or outer peripheries extending around a common axis. The planar resonators are typically excited into a cos 2θ resonance mode that exists as a degenerate pair of vibration modes at a mutual angle of 45°. One of these modes is excited as the carrier mode. When the structure is rotated around the axis normal to the plane of the ring, Coriolis forces couple energy into a response mode. The amplitude of motion of the response mode gives a direct measure of the applied rotation rate.

A disadvantage of the ring structure is that the sectional seismic masses and their displacements are relatively small, resulting to low signal levels. Also the dimensions of the sectional actuation and sensing structures make the functions indistinguishable and thus compromised.

SUMMARY

An object of the present invention is to provide a compact gyroscope structure that is insensitive to external shocks. The objects of the present invention are achieved with a gyroscope structure according to the characterizing portions of the independent claims.

In certain embodiments, a microelectromechanical gyroscope structure includes a first pair of drive structures having a first drive structure and a second drive structure. The first drive structure is coupled to a first seismic mass and the second drive structure is coupled to a second seismic mass. A second pair of drive structures includes a third drive structure and a fourth drive structure, and the third drive structure is coupled to a third seismic mass and the fourth drive structure is coupled to a fourth seismic mass. Each drive structure includes a transducer configured to induce primary oscillation of the corresponding seismic mass. A first pair of sense structures includes a first sense structure and a second sense structure, and a second pair of sense structures comprising a third sense structure and a fourth sense structure. The seismic masses of at least one pair of the first and second drive structures are coupled to oscillate in opposite phase and are aligned to a common axis of primary oscillation. An axis of primary oscillation of the first pair of drive structures and an axis of primary oscillation of the second pair of drive structures extend orthogonally along a plane of oscillation. Each sense structure includes a sense device and a coupling spring structure; the coupling spring structure connects the sense device to at least one seismic mass of the first pair of drive structures and to at least one seismic mass of the second pair of drive structures. The coupling structure is configured to relay to the sense device a component of the motion of each of the seismic masses in a direction perpendicular to their axis of primary oscillation, and to absorb a component of the motion of each of the seismic masses in a direction of their axis of primary oscillation. The sense device is suspended to a static support and configured to oscillate in a direction diagonal to the axis of primary oscillation of the first pair of drive structures and diagonal to the axis of primary oscillation of the second pair of drive structures.

Embodiments of the invention can also include a gyroscope that includes the microelectromechanical gyroscope structure. Various embodiments of the invention are disclosed in the specification and recited in the dependent claims.

Embodiments of the present invention are based on an arrangement of drive and sense structures and coupling spring structures, which allows orthogonally directed motions of larger scale drive and sense structures in a very limited surface area.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of gyroscope structures that are generally known to a person skilled in the art may not be specifically described herein.

Figure 1:
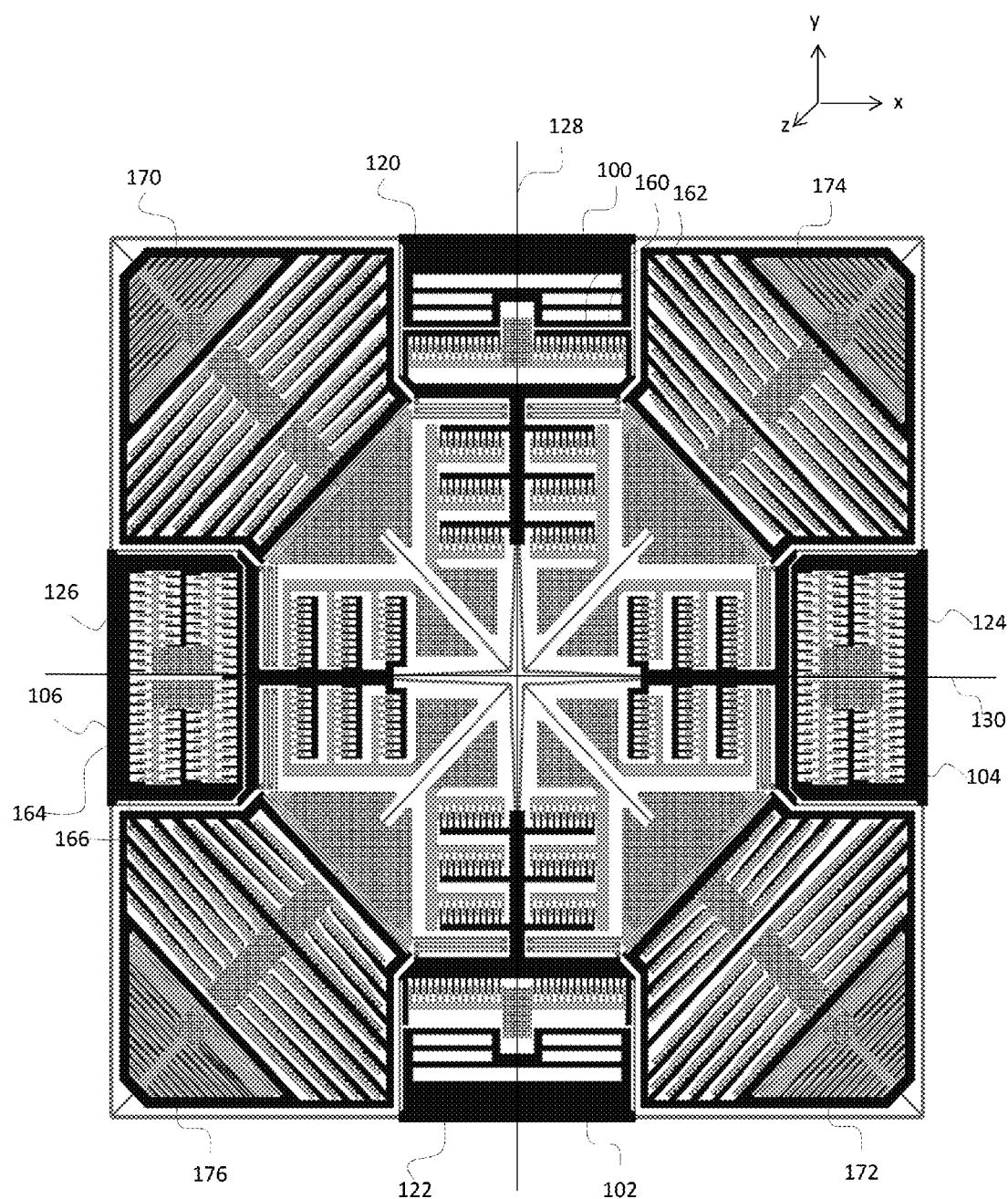
FIG. 1 illustrates an embodiment of a gyroscope structure.
Figure 2:
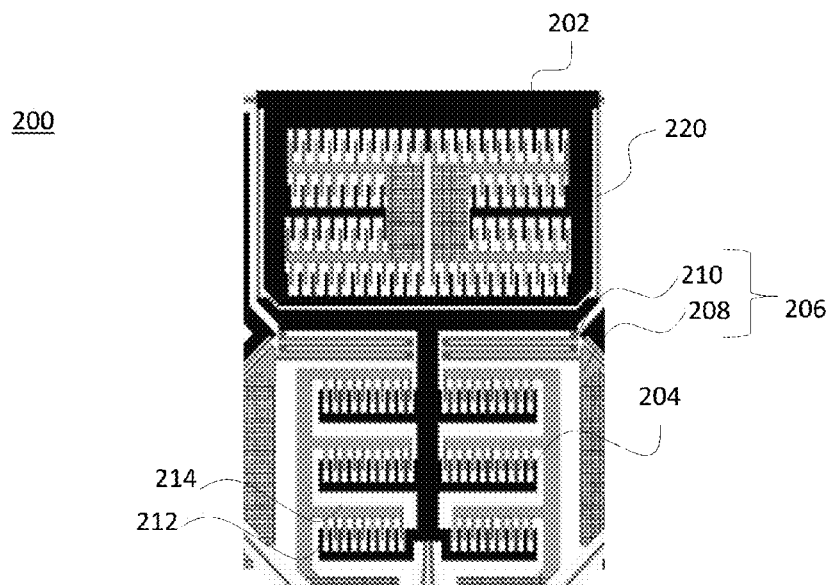
FIG. 2 illustrates an exemplary drive structure.

FIG. 1 illustrates an embodiment of a gyroscope structure according to an embodiment of the present invention. The shown structure includes four seismic masses 100, 102, 104, 106, drive structures 120, 122, 124, 126, and sense structures 170, 172, 174, 176. Two drive structures 120, 122 form a first pair of drive structures, and other two drive structures 124, 126 form a second pair of drive structures. FIG. 2 illustrates in more detail an exemplary drive structure 120 of FIG. 1.

A drive structure 200 refers here to a combination of elements that suspend a seismic mass 202 and induce it to a drive mode primary oscillation. The term seismic mass refers here to a mass body that may be suspended to a static support to provide an inertial movement. The seismic mass 202 may have a planar form. This means that at least part of the volume of the seismic mass extends along a plane in two dimensions (length, width) and forms therein a planar surface. Within tolerances, the planar surface of the seismic mass can be considered to contain straight lines that connect any two points on it. It is, however, understood that the surface may include protrusions patterned on the seismic mass, or recesses patterned into the seismic mass.

For the primary oscillation, the drive structure 200 may suspend the seismic mass 202 to another body element of the gyroscope by means of a first spring structure 206, 220 that allows the seismic mass 202 two degrees of freedom in a plane of oscillation. The first spring structure may include a primary element 206 for the first degree of freedom and a secondary element 220 for the second degree of freedom. The primary element 206 may include an anchor element 208 and a suspension spring 210. The anchor element 208 may provide a connection to a static (non-oscillating) support, typically to another body element. If the gyroscope structure is a MEMS structure wafer, the other body element may be provided, for example, by an underlying handle wafer, or a covering cap wafer of a gyroscope die. The suspension spring 210 may extend between the seismic mass 202 and the anchor element 208 in a directional manner such that the suspension spring 210 is very elastic in one direction and rigid in another direction that is perpendicular to it. This means that the force that the suspension spring 210 exerts against its displacement in one direction is multifold to the force the suspension spring 210 exerts against its displacement in a direction perpendicular to it. The direction in which the suspension spring 210, and thereby the primary element 206 is elastic may correspond to the first degree of freedom, i.e. the direction of primary oscillation of the seismic mass 202. Primary oscillation refers here to directional reciprocating motion, which results from excitation of the seismic mass 202.

The secondary element 220 may be arranged between the seismic mass 202 and the primary element 206 in a directional manner and orthogonally such that the direction in which the secondary element is elastic may correspond to the second degree of freedom, i.e. the direction of secondary oscillation of the seismic mass 202. Secondary oscillation refers here to directional reciprocating motion, which results from Coriolis force resulting from angular motion induced to the gyroscope structure. The secondary element may include a bending beam positioned such that its longitudinal dimension is initially in the direction of the primary oscillation of the seismic mass 202 and couples directly or indirectly a lateral point in the seismic mass 202 and a lateral point of the primary element 206. FIG. 2 illustrates indirect coupling that includes a rigid oblique extension that offsets the coupled points in the plane of oscillation. Other spring structures for arranging directional oscillation may be applied within the scope. As a result of combining the primary element 206 and the secondary element 220, the seismic mass 202 has a degree of freedom in the direction of primary oscillation and in the direction of secondary oscillation.

The drive structure 200 may comprise also a transducer 204 that transforms input electrical energy into mechanical energy of the seismic mass. The exemplary drive structure of FIG. 2 applies electrostatic actuation with a comb drive where the capacitances between stator comb 212 and rotor comb 214 pairs changes linearly with displacement of the rotor comb. Other forms of capacitive actuation may be applied within the scope. For example, parallel plate combs or hybrid combs that combine features of parallel plate and longitudinal capacitors may be used. Also piezoelectrical excitation may be applied. Corresponding excitation methods are well known to a person skilled in the art, and will not be discussed in more detail herein.

Returning to FIG. 1, in the first pair of drive structures 120, 122, and the second pair of drive structures 124, 126, the seismic masses are coupled for antiphase primary oscillation in a direction of a common axis of primary oscillation 128, 130, respectively. An axis of primary oscillation refers here to an axis that is aligned with the direction of the primary oscillation, and coincides with the seismic mass. Advantageously the seismic mass has an axis of symmetry and the axis of primary oscillation coincides with the axis of symmetry of the seismic mass. Primary oscillation of two seismic masses 100, 102 or 104, 106 coupled to the pair of drive structures 120, 122 or 124, 126 is configured to take place in a direction of a common axis of primary oscillation 128 or 130, respectively.

The configuration of FIG. 1 is shown associated to directions X and Y, which will herein be referred to as horizontal and vertical directions. One drive structure of the first pair of the drive structures may be called a first vertical drive structure 120 and the opposite drive structure of the first pair of the drive structures a second vertical drive structure 122. Correspondingly, the second pair of drive structures may include a first horizontal drive structure 124 and a second horizontal drive structure 126. In primary motion, the seismic mass in each of the vertical drive structures 120, 122 oscillates reciprocally in a direction of a vertical axis 128 of primary oscillation. Correspondingly, the seismic mass of each of the horizontal drive structures 124, 126 oscillates reciprocally in a direction of a horizontal axis 130 of primary oscillation.

The primary oscillation of the seismic masses in a pair of drive structures is anti-phase motion. This means, for example, that the oscillation of the seismic mass of the first vertical drive structure 120 has the same frequency and is referenced to a same point in time as the seismic mass of the second vertical drive structure 122, but the phase difference between them is 180 degrees (π radians). Accordingly, the seismic masses move with a same rate towards each other or away from each other. Primary oscillation of the seismic masses of the horizontal drive structures is similar, but in the horizontal direction.

Figure 3:
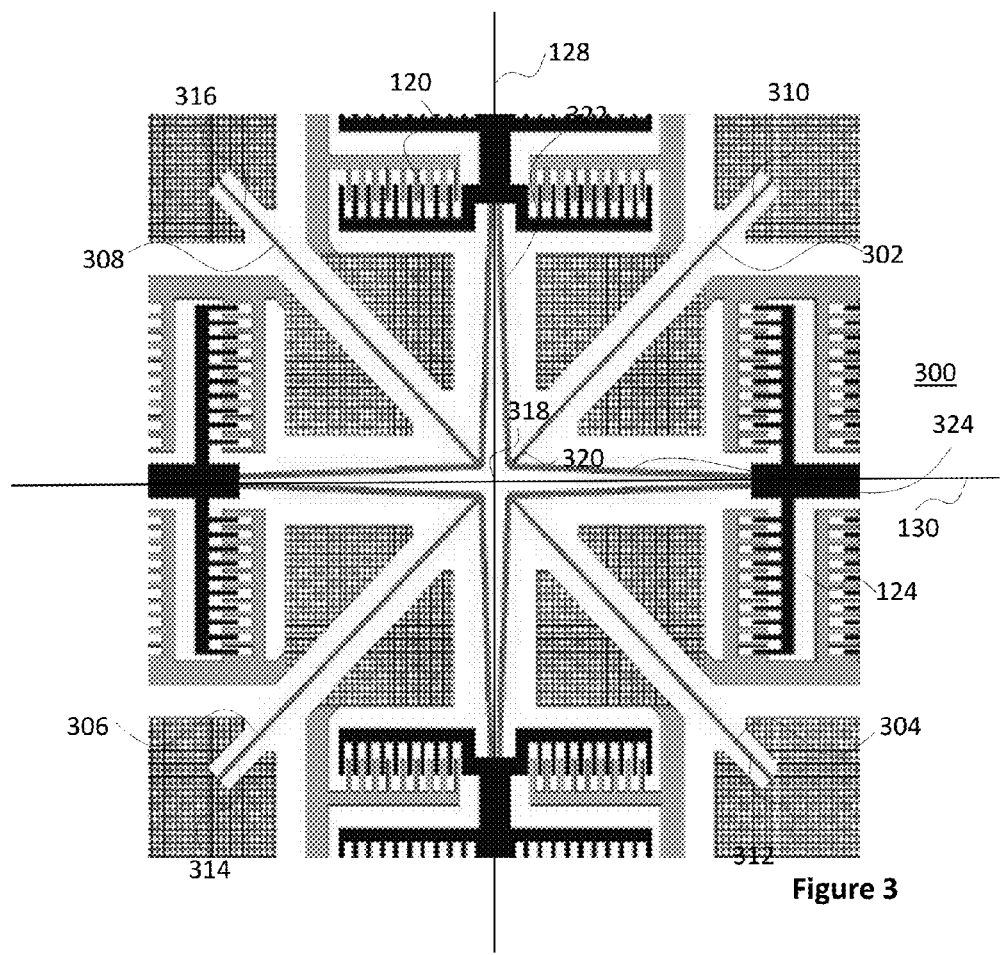
FIG. 3 shows an exemplary central spring structure.

Direction of the primary oscillation of the seismic mass depends on the geometry of the drive structure. The direction may be further substantiated with a drive coupling spring structure that improves the accuracy of frequency and direction of the anti-phase drive motion. FIG. 3 shows in more detail an exemplary central spring structure 300 of FIG. 1 for such drive coupling. The spring structure 300 includes a number of elongate beams that may be considered to rigidly relay motion in a direction of their longitudinal dimension, but flex in a direction perpendicular to their longitudinal dimension. The spring structure may include four diagonal beams 302, 304, 306, 308. One end of each of the diagonal beams 302, 304, 306, 308 may be anchored to a static support in an anchor point 310, 312, 314, 316 between a seismic mass of a first pair of drive structures and a seismic mass of a second pair of drive structures. The diagonal beams 302, 304, 306, 308 may extend from their respective anchor points inwards, meaning towards a center point 318 within the gyroscope structure where the vertical axis of primary oscillation 128 and the horizontal axis of primary oscillation 130 cross. The other end of the diagonal beams 302, 304, 306, 308 may be connected to two coupling beams that extend from the point of connection through drive structures to neighboring seismic masses.

For example, the diagonal beam 302 of FIG. 3 is supported to the anchor point 310 and extends inwards therefrom. At a connection point 320, before the center point 318, the diagonal beam 302 is connected to two coupling beams 322, 324. One end of the first coupling beam 322 is connected to one end of the second coupling beam 324 and to one end of the diagonal beam 302, and the other end of the first coupling beam 322 is connected to move along the primary oscillation of the first vertical drive structure 120. The other end of the first coupling beam 322 may be connected to a moving part of the first vertical drive structure 120, advantageously to a point in its axis of primary oscillation 128. One end of the second coupling beam 324 is connected to one end of the first coupling beam 322 and to one end of the diagonal beam 302, and the other end of the second coupling beam 324 is connected to move along the first horizontal drive structure 124. The other end of the second coupling beam 324 may be connected similarly to a point in the axis of primary oscillation of the first horizontal drive structure 124.

Similar coupling beam pairs may be arranged to connect inward pointing ends of each of the diagonal beams 302, 304, 306, 308, as shown in FIG. 3. Since the connection point 320 of the diagonal beam 302 and its two coupling beams 322, 324 is in a position before the center point 318, the coupling beams 322, 324 that connect to a first vertical drive structure 120 form initially a small acute angle with its axis 128 of primary oscillation. The same orientation of coupling beams may repeat for all drive structures.

Figure 4:
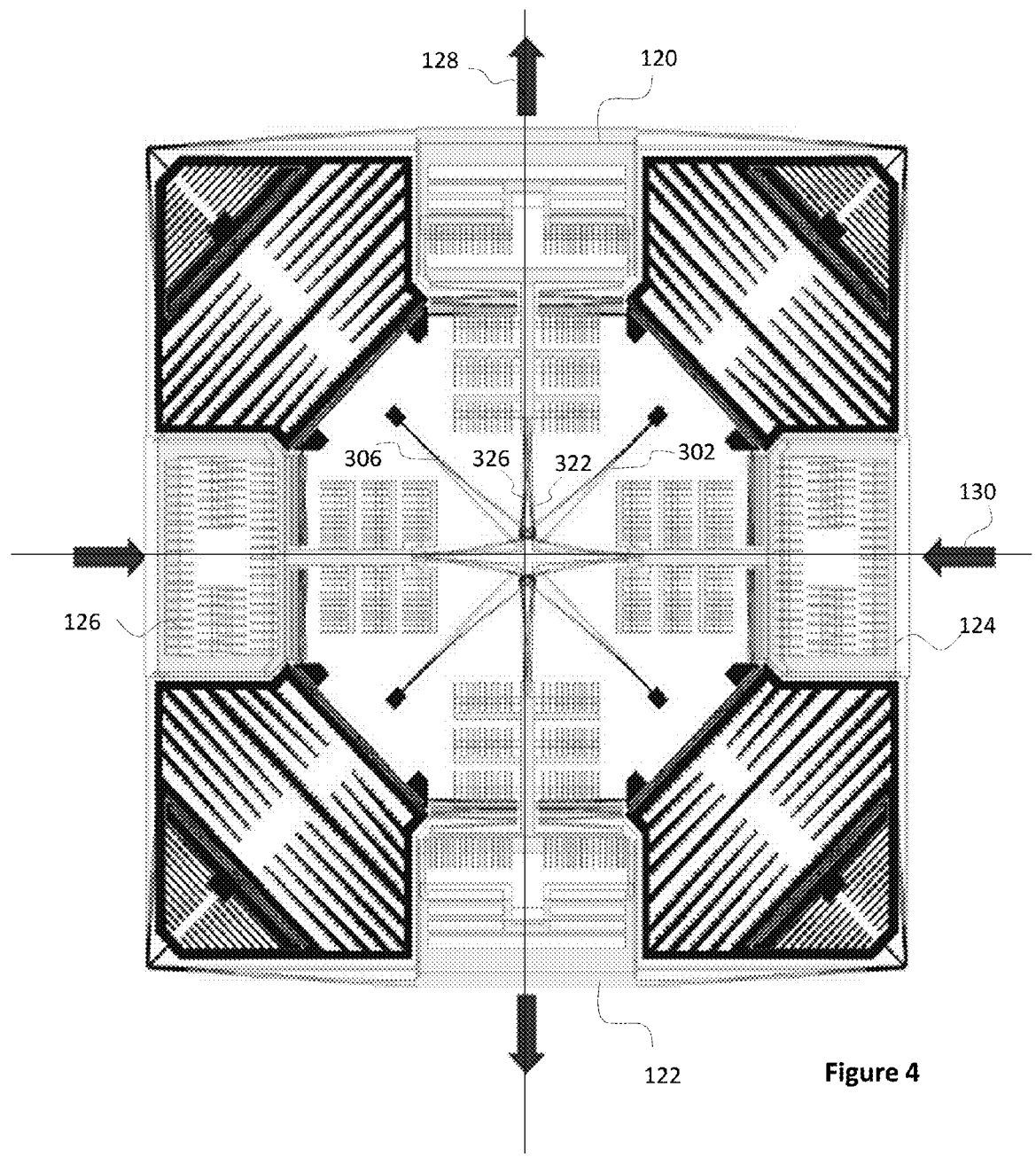
FIG. 4 illustrates drive mode motion of the gyroscope structure.

FIG. 4 illustrates operation of the drive structure configurations of FIG. 1 during primary motion when the structure is in operation. When the first vertical drive structure 120 moves outwards in the direction of the axis 128 in primary motion, the coupling beams 322, 326 move along with the primary oscillation, and flex towards the axis 128. Also the coupled ends of diagonal beams 302, 306 flex towards the axis 128 along with the primary oscillation, and the acute angle of the coupling beams 322, 326 with the axis 128 of primary oscillation of first vertical drive structure 120 decreases. The corresponding flexing and decrease of the acute angle between the corresponding coupling beams and the axis 128 happens in the opposite side in the second vertical drive structure 122. However, at the same time the acute angle between the corresponding coupling beams and the axis 130 in the neighboring horizontal drive structures 124, 126 increases.

On the other hand, when the vertical drive structures 120, 122 move inwards (not shown), and the neighboring drive structures 124, 126 are in outward motion. The acute angle between the coupling beams 322, 326 of the first vertical drive structure 120 increases. The corresponding flexing and decrease of the acute angle between the corresponding coupling beams and the axis 128 happens in the opposite side in the second vertical drive structure 122. The coupled ends of diagonal beams 302, 306 flex away from the axis 128 along with the primary oscillation. The acute angle between the corresponding coupling beams of the horizontal drive structures 124, 126 and the axis 130 decreases, and the coupled ends of their diagonal beams flex towards the axis 130.

The described combination of the diagonal beams and the coupling beams forms a drive coupling spring structure that very efficiently forces the primary oscillation of each opposite pair of drive structures to anti-phase mode, and the primary oscillation of the two pairs of drive structures to two orthogonal directions of the common axes 128, 130 of primary oscillation.

The drive structures may include also further elements for other characteristics provided by the gyroscope structure. For example, the vertical drive structures 120, 122 of FIG. 1 are shown to include further comb structures 160, 162 for drive sense signals. Such signals may be applied for controlled force feedback operations within the drive structure. As another example, the horizontal drive structures 124, 126 of FIG. 1 may include further comb structures 164, 166 for electrostatic quadrature compensation.

A sense structure refers here to an element that is arranged to sense a specific motion of at least one seismic mass, and generate a signal that corresponds with the sensed motion. In a gyroscope structure, the sensed motion results from Coriolis force that is created by angular motion of the gyroscope structure. The gyroscope structure may include a first pair of sense structures 170, 172 and a second pair of sense structures 174, 176.

Figure 5:
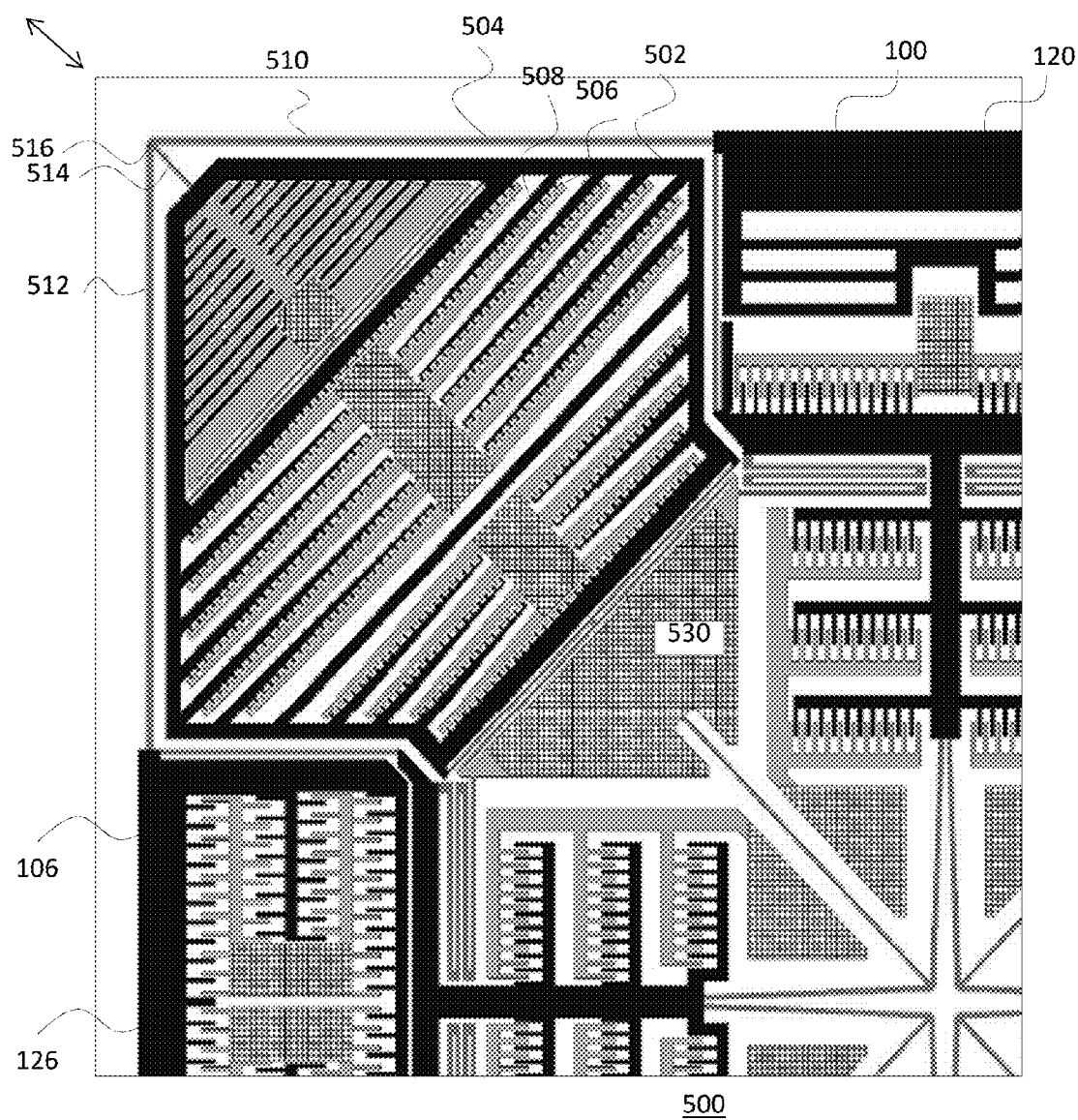
FIG. 5 illustrates an exemplary sense structure.

FIG. 5 shows in more detail the exemplary sense structure 170 of FIG. 1. A sense structure 500 may include a sense device 502, and a sense coupling spring structure 504. The sense device 502 may comprise a transducer that transforms input mechanical energy into electric energy. The input mechanical energy results from motion of the one or more seismic masses the sense device is coupled to. The transducer may include a stator 506 and a rotor 508. The sense device 502 may also include a second spring structure 530 arranged to suspend the rotor to a static support such that it can oscillate in a direction diagonal to the axis 128 of primary oscillation of the vertical pair of drive structures, and diagonal to the axis 130 of the horizontal pair of drive structures. A diagonal direction in this context means that the direction forms a 45° (π/4) angle with the axis. In the structure of FIG. 1, it may be seen that the second spring structure 530 is very elastic in the diagonal direction and very rigid in directions other than the diagonal direction.

The sense coupling spring structure 504 may couple the rotor 508 to two seismic masses, a seismic mass 100 of a neighboring drive structure 120 of the vertical pair of drive structures, and a seismic mass 106 of a neighboring drive structure 126 of the horizontal pair of drive structures. The sense coupling spring structure 504 may be configured to relay to the rotor 508 a component of motion of the seismic mass 100 of the neighboring drive structure 120 of the vertical pair of drive structures in a direction perpendicular to its axis 128 of primary oscillation, and deflect in a direction of its axis 128 of primary oscillation. Correspondingly, sense coupling spring structure 504 may be configured to relay to the rotor 508 a component of motion of the seismic mass 106 of the neighboring drive structure 126 of the horizontal pair of drive structures in a direction perpendicular to its axis 130 of primary oscillation, and deflect in a direction of its axis 130 of primary oscillation.

In the exemplary structure of FIG. 5, the sense coupling spring structure 504 may include a first sense beam 510 and a second sense beam 512. The rotor 508 may extend via an extension beam 514 to a coupling point 516. The first sense beam 510 may extend between the coupling point 516 and the seismic mass 100 of the vertical drive structure 120 and the second sense beam 512 may extend between the coupling point 516 and the seismic mass 106 of the horizontal drive structure 126. At sensing, the components of motion of the seismic masses 100, 106 accumulate and result in linear oscillation in the diagonal direction shown with the arrow of FIG. 5. The configuration of elements may be repeated symmetrically in all sense structures 170, 172, 176, 174, as shown in FIG. 1.

Figure 6:
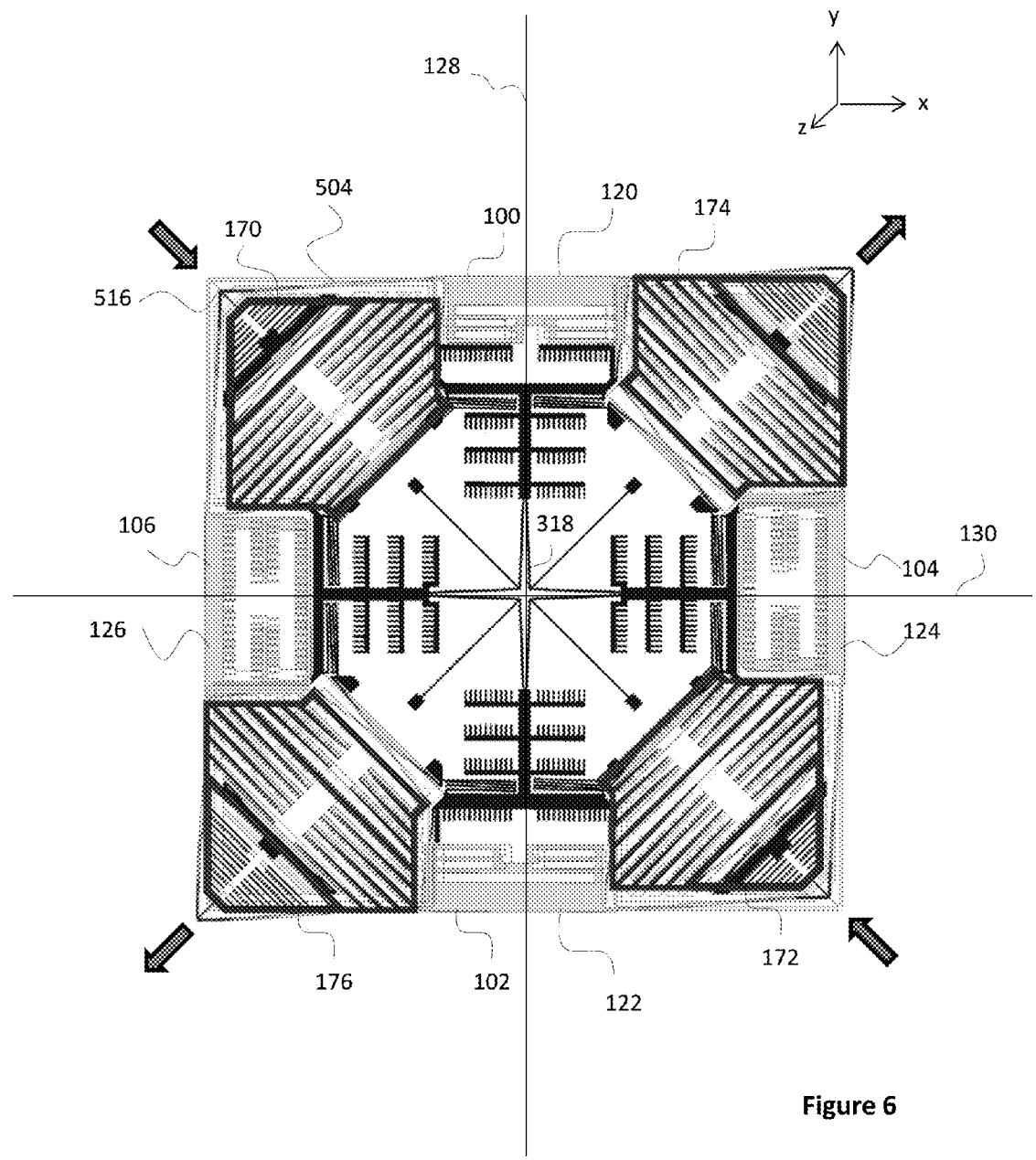
FIG. 6 illustrates sense mode motion of the gyroscope structure.

FIG. 6 illustrates sense mode motion (secondary oscillation) of the described structures of the gyroscope structure. When the primary mode motion takes place as described in FIG. 4, angular motion of the gyroscope structure may create a Coriolis force that falls upon the seismic masses of the gyroscope structure in a direction perpendicular to their primary oscillation. As an example, let us assume that the structure of FIG. 1 is exposed to angular motion in z-direction. At a certain point of time illustrated in FIG. 6, the Coriolis force may be considered to displace the seismic mass 100 coupled to the first vertical drive structure 120 to the positive x-direction, the seismic mass 102 of the second vertical drive structure 122 to the negative x-direction, the seismic mass 104 of the first horizontal drive structure 124 to the positive y-direction, and the seismic mass 106 of the second horizontal drive structure 126 to the negative y-direction.

The sense coupling spring structure 504 relays these displacements to the coupling point 516 of the first sense structure 170, and induces the rotor of the first sense structure 170 into linear motion in a direction shown with an arrow. The shown direction is diagonal to the axis 128 of primary oscillation of the first vertical drive structure 120 and to the axis 130 of primary oscillation of the second horizontal drive structure 126. In the specific point of time of FIG. 6, the displacements of the seismic masses 100, 106 can be considered to move the rotor of the first sense structure 170 diagonally inwards, towards the center point 318. At the same time, the displacements of the seismic masses 102, 104 may be considered to move a rotor of a second sense structure 172 of the first pair of sense structures similarly diagonally inwards. On the other hand, the displacements of seismic masses 100, 104 are relayed to a rotor of a first sense structure 174 of the second pair of sense structures, inducing it to move diagonally outwards, away from the center point 318. Similarly, seismic masses 102, 106 may be considered to move the rotor of a second sense structure 176 of the second pair of sense structures diagonally outwards.

When the direction of the displacement of the seismic masses reverses (not shown), the displacements of the seismic masses 100, 106 can be considered to move the rotor of the first sense structure 170 diagonally outwards, the displacements of the seismic masses 102, 104 to pull the rotor of the second sense structure 172 of the first pair of sense structures diagonally outwards, the displacements of the seismic masses 100, 104 to push the rotor of the first sense structure 174 of the second pair of sense structures diagonally inwards, and the displacements of the seismic masses 102, 106 to push the rotor of the second sense structure 176 of the second pair of sense structures diagonally inwards. Accordingly, angular motion of the structure induces diagonal cyclic oscillation of rotors of the orthogonally directed sense structures 170, 172, 174, 176. This oscillation is secondary oscillation that may be converted into an electrical signal that represents the angular motion experienced by the gyroscope structure.

Due to the described symmetric and orthogonal arrangement of the seismic masses 100, 102, 104, 106, drive structures 120, 122, 124, 126, and sense structures 170, 172, 174, 176, the total linear momentum and angular momentum of elements moving in the primary oscillation and in the secondary oscillation during a cycle of oscillation is practically zero. This significantly reduces the extent to which the drive mode and the sense mode couple to linear or angular acceleration. In addition, the arrangement of elements results in balanced inertial forces. This reduces leaking of energy to the surroundings, and thereby enables a high quality factor for resonators implemented with the configuration. The balanced inertial forces also provide robustness against external vibration.

Furthermore, in the described configuration, the drive mode and sense mode resonance frequencies are the lowest ones. All other modes may be at least two times higher in frequency than the drive mode and the sense mode. In microscale elements, manufacturing tolerances are inevitable. In conventional structures, external shocks or vibrations may therefore cause a common mode motion that tends to couple to the drive or sense motion. These modes occur typically in a frequency that is close to the frequency of the drive motion or the sense mode resonance frequency, and lower than at least either of them. Now that the undesired common mode frequencies are remarkably higher, the mode is also stiffer, and the amplitude of the motion caused by external vibrations is smaller. The configuration of the claimed drive and sense structures provides a strong coupling (i.e. the difference in frequency of common mode and differential mode vibrations is large, of the order of the frequency of the differential mode vibrations), which makes the gyroscope structure exceptionally robust against external vibration.

Due to the specific arrangement of drive and sense structures and coupling spring structures, the sense structures do not essentially displace in the drive mode, and the drive structures do not essentially displace in the sense mode. Since the displacement of the sense structures in the drive mode is effectively minimized, common mode error signals from a pair of sense structures are very small. In addition, errors may be further reduced by applying differential measuring principles that, as such, are well known to a person skilled in the art.

In microelectromechanical structures there may exist second-order effects, like harmonic signals caused by nonlinear and/or rotational displacements of the moving elements. In the described configuration, the displacements of the drive structures and the sense structures are and remain rectilinear, even with high amplitudes of up to ten micrometers.

Figure 7:
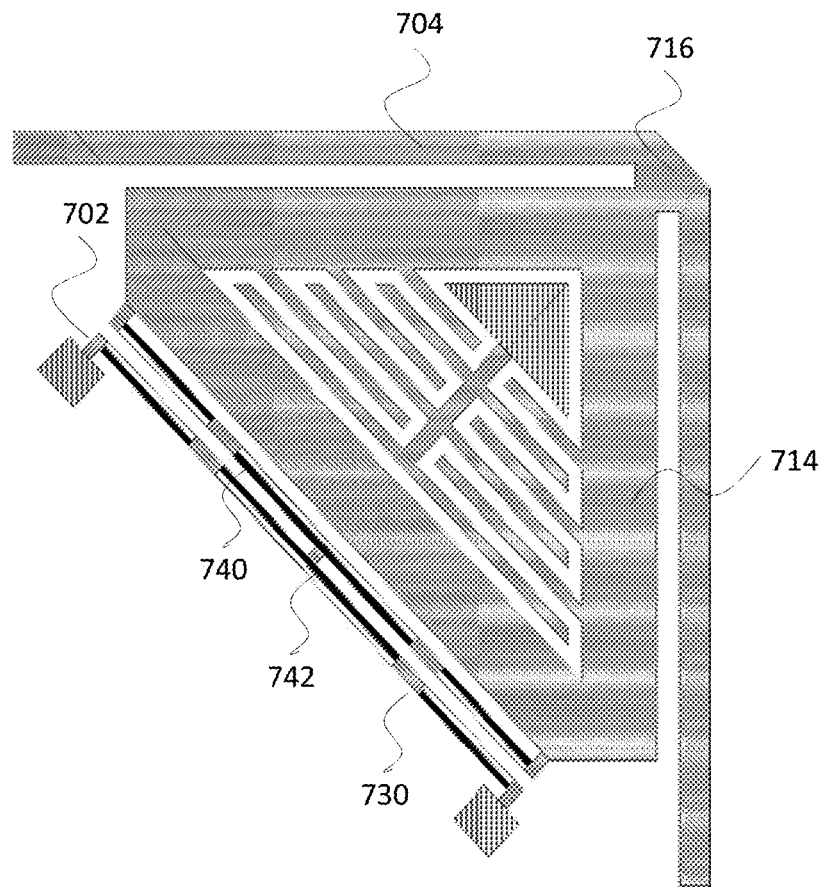
FIG. 7 illustrates another exemplary sense structure.

FIG. 7 illustrates an alternative sense structure applicable in a microelectromechanical gyroscope structure. In this solution, the transition from the mechanical into electrical domain applies piezoelectricity. The sense structure may include a piezoelectric sense device 702, and a second spring structure 730 arranged to suspend the sense device 702 to a static support such that it can move in a direction diagonal to the axis of primary oscillation of the vertical pair of drive structures, and diagonal to the axis of the horizontal pair of drive structures.

As described in FIG. 5, the sense coupling spring structure 704 may couple the sense device 702 to two seismic masses relay to the sense device a component of motion of both of the seismic masses. The sense device 702 may extend via an extension structure 714 to a coupling point 716 to connect with the coupling spring structure 704. At sensing, the components of motion of the seismic masses accumulate and result in linear oscillation in the diagonal direction shown with the arrow of FIG. 7.

The piezoelectric sense device 702 may include at least one detection element 740. The detection element may be a detection beam, arranged to deflect according to the motion of the coupling point. The detection beam 740 may be coupled from both of its ends to the mobile extension structure 714 and from its center to an anchor, or anchored structure. FIG. 7 shows an example, where the sense device includes a first beam 740, and a second beam 742. The first beam 740 may be coupled from both of its ends to the mobile extension structure 714, and from its center to the center of the second beam 742. The second beam 742 may be anchored to a support structure from each of its ends. By means of this, the coupling beams 740, 742 are arranged to deflect according to motion of the coupling point. The detection beams 740, 742 may include a piezoelectric film deflecting along the deflection of the detection beam. The resulting charge may be read and used as a signal to represent the sensed motion.

Figure 8:
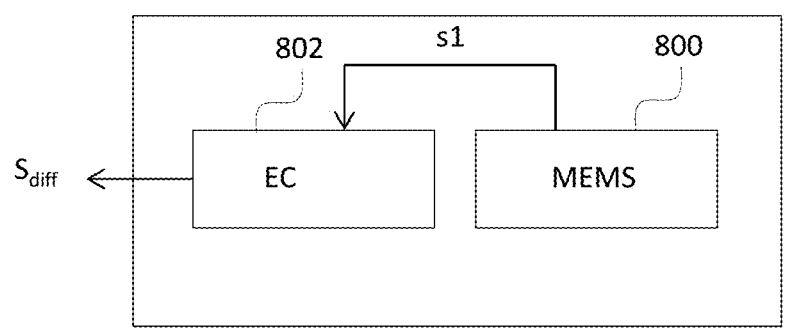
FIG. 8 illustrates elements of a gyroscope.

FIG. 8 illustrates elements of a gyroscope that includes a first part 800 and a second part 802. The first part 800 may include the gyroscope structure of FIG. 1, and the second part 802 may include an electrical circuit that is connected to exchange electrical signals with the gyroscope structure. As shown in FIG. 2, signals s1 may be input from sense structures to the electrical circuit 802, or from the electrical circuit to the gyroscope structure. An output signal S corresponding to the detected angular motion may be calculated from the signals s1.

The gyroscope may be included in a combined sensor element that includes a variety of sensor elements, a wired or mobile computing, gaming or communication device, a measurement device, a rendering device, or a vehicle function control unit, to name a few.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical gyroscope structure, comprising:
    a first pair of drive structures comprising a first drive structure and a second drive structure, wherein said first drive structure is coupled to a first seismic mass and the second drive structure is coupled to a second seismic mass;
    a second pair of drive structures comprising a third drive structure and a fourth drive structure, wherein the third drive structure is coupled to a third seismic mass and the fourth drive structure is coupled to a fourth seismic mass,
    wherein each drive structure includes a transducer configured to induce primary oscillation of the corresponding seismic mass;
    a first pair of sense structures comprising a first sense structure and a second sense structure;
    a second pair of sense structures comprising a third sense structure and a fourth sense structure;
    wherein the seismic masses of at least one pair of the first and second drive structures are coupled to oscillate in opposite phase and aligned to a common axis of primary oscillation, wherein an axis of primary oscillation of the first pair of drive structures and an axis of primary oscillation of the second pair of drive structures extend orthogonally along a plane of oscillation,
    wherein each sense structure includes a sense device and a coupling spring structure, wherein the coupling spring structure connects the sense device to at least one seismic mass of the first pair of drive structures and to at least one seismic mass of the second pair of drive structures,
    wherein the coupling spring structure is configured to relay to the sense device a component of the motion of each of the seismic masses in a direction perpendicular to their axis of primary oscillation, and to absorb a component of the motion of each of the seismic masses in a direction of their axis of primary oscillation, and
    wherein the sense device is suspended to a static support and configured to oscillate in a direction diagonal to the axis of primary oscillation of the first pair of drive structures and diagonal to the axis of primary oscillation of the second pair of drive structures.

2. The microelectromechanical gyroscope structure of claim 1, wherein the first drive structure comprises a first vertical drive structure coupled to the first seismic mass and the second drive structure comprises a second vertical drive structure coupled to the second seismic mass,
    wherein the third drive structure comprises a first horizontal drive structure coupled to the third seismic mass and the fourth drive structure comprises a second horizontal drive structure coupled to the fourth seismic mass,
    wherein the first sense structure is coupled to the first seismic mass and the fourth seismic mass,
    wherein the second sense structure is coupled to the second seismic mass and the third seismic mass,
    wherein the third sense structure is coupled to the first seismic mass and the third seismic mass, and
    wherein the fourth sense structure is coupled to the second seismic mass and the fourth seismic mass.

3. The microelectromechanical gyroscope structure of claim 1, wherein the direction of oscillation of the sense device, which direction is diagonal to the axis of primary oscillation, forms a 45 o ($\pi/4$) angle with the axis of primary oscillation.

4. The microelectromechanical gyroscope structure of claim 1, wherein each of the drive structures includes a first spring structure that allows for the coupled seismic mass two degrees of freedom.

5. The microelectromechanical gyroscope structure of claim 4, wherein
the first spring structure includes a primary element for the first degree of freedom and a secondary element for the second degree of freedom,
the primary element includes an anchor element and a suspension spring that extends between one seismic mass of the seismic masses and the anchor element,
the suspension spring is elastic in the direction of the direction of the primary oscillation of the one seismic mass,
the secondary element couples the one seismic mass and the primary element and is elastic in a direction of the secondary oscillation of the one seismic mass, and wherein the direction of the secondary oscillation of the one seismic mass is orthogonal to the direction of the primary oscillation of the one seismic mass.

6. The microelectromechanical gyroscope structure of claim 1, further comprising a drive coupling spring configured to force the primary oscillation of opposite pairs of drive structures to anti-phase mode.

7. The microelectromechanical gyroscope structure of claim 6, wherein
the drive coupling spring comprises four diagonal beams, with one end of each of the diagonal beams being anchored to an anchor point between one of the first and second seismic masses and one of the third and fourth seismic masses,
wherein the diagonal beams extend from their respective anchor points toward a center point within the gyroscope structure, and
wherein another end of each of the diagonal beams is connected in a point of connection to two coupling means, one of which extends from the point of connection to the one of the first and second seismic masses, and another one of which extends from the point of connection to the one of the third and fourth seismic masses.

8. The microelectromechanical gyroscope structure of claim 1, wherein in each of the sense structures, the coupling spring structure includes a first sense beam and a second sense beam,
wherein the sense device includes a rotor that extends via an extension beam to a coupling point,
wherein the first sense beam extends between the coupling point and the at least one of the first and second seismic masses, and
wherein the second sense beam extends between the coupling point and the one of the third and fourth seismic masses.

9. The microelectromechanical gyroscope structure of claim 1, wherein
the sense device includes at least one flexible detection element, coupled to a coupling point, and configured to deflect according to motion of the coupling point, and
wherein one or more of the flexible detection elements includes a piezoelectric film deflecting along the deflection of the detection element.

10. A microelectromechanical gyroscope, comprising an electrical circuit and a microelectromechanical gyroscope structure according to claim 1.

* * * * *